United States Patent [19]

Wilson

[11] Patent Number: 5,008,889
[45] Date of Patent: Apr. 16, 1991

[54] HIGH-ACCURACY WAVELENGTH STABILIZATION OF ANGLED-STRIPE SUPER LUMINESCENT LASER DIODE SOURCES

[76] Inventor: Keith E. Wilson, 1104 Hugh Reid Dr., Arcadia, Calif. 91007

[21] Appl. No.: 432,581

[22] Filed: Nov. 6, 1989

[51] Int. Cl.⁵ ............................................... H01S 3/13
[52] U.S. Cl. ...................................... 372/32; 372/45; 372/50; 350/96.15; 350/96.29; 357/17
[58] Field of Search .................................. 372/43–45, 372/46, 50, 29, 32, 31, 108; 350/96.15, 96.17

[56] References Cited

U.S. PATENT DOCUMENTS

| | | | |
|---|---|---|---|
| 4,603,421 | 6/1986 | Seifres et al. | 372/50 |
| 4,799,229 | 1/1989 | Miyazawa et al. | 392/50 |
| 4,821,277 | 4/1989 | Alphonse et al. | 372/45 |
| 4,842,358 | 6/1989 | Hall | 350/96.15 |
| 4,856,014 | 8/1989 | Figueroa et al. | 372/46 |
| 4,901,123 | 2/1990 | Noguchi et al. | 357/17 |

Primary Examiner—Frank Gonzalez
Assistant Examiner—Galen J. Hansen

[57] ABSTRACT

An angled-stripe superluminescent laser diode (SLD) light source emits both coherent and incoherent radiation simultaneously, but the two beams are separated spatially. A method and apparatus for stabilizing the emission wavelength of a broadbent light source for a fiber-optic rotation-sensing gyro uses the coherent radiation from an angled-stripe SLD as the optical source in a large-optical-pathlength-difference interferometer to generate an error signal which is fed back to the current source of the SLD to stabilize the wavelength of the incoherent part of the SLD light output.

26 Claims, 2 Drawing Sheets

HIGH-ACCURACY WAVELENGTH STABILIZATION OF ANGLED-STRIPE SUPER LUMINESCENT LASER DIODE SOURCES

BACKGROUND OF THE INVENTION

1. Field of the Invention

This invention relates to superluminescent diodes. In particular, it relates to angled-stripe devices and methods of stabilizing the wavelengths of these broad-bandwidth optical sources.

2. Description of the Related Art

The design of an interferometric fiber-optic sensing system depends on the stability of the wavelength of the optical source. In particular, for the fiber-optic rotation sensors to be useful in navigation, the emission wavelength of the optical source must be controlled to one part in a million or better.

Wavelength stabilization of the optical source has been accomplished by using a thermally-compensated optical interferometer to detect changes in the emission wavelength of the source. In a thermally-compensated interferometer, the interferometer is designed so that phase shifts occur in the interferometer only in response to shifts in the wavelength of the incident light and not in response to changes in ambient temperature. Shifts in the source wavelength generate an error signal in the interferometer. This signal is used to correct the emission wavelength of the source.

The light source most suitable for the fiber-optic rotation sensor is the superluminescent laser diode or SLD. The SLD emits in a broad spectral band which reduces phase noise in the sensor caused by the Kerr effect and by coherent backscatter in the fiber. The SLD most often used for rotation sensors is a device which is a modified laser diode. In the SLD, the optical feedback present in laser diodes is suppressed by either anti-reflection coating of the laser diode facets, or by truncating the current stripe on the diode so that there is a light-absorbing region between the end of the truncated stripe and the rear facet of the diode. Because of the absence of feedback, these devices emit only incoherent light, the type of light that is required by the fiber-optic rotation sensor.

Although the SLD's fabricated by either the truncated current-stripe method or with anti-reflection coatings are appropriate as sources for fiber-optic rotation sensors, high accuracy control of the emission wavelength of these devices is made difficult by the short coherence length of the source. For these devices, this length is typically on the order of 20 um to 60 um. To generate an error signal in response to changes in the emission wavelength of the source, interferometers must therefore be designed and fabricated with optical pathlength differences (opds) on the order of the coherence length of the SLD.

The design and fabrication of short opd interferometers is challenging and expensive. In addition, because the sensitivity of an interferometer to wavelength changes is proportional to the opd between the interfering optical waves, it is most desirable to use thermally-compensated interferometers with large opds that are inexpensive and easy to fabricate.

Because of its structure, the angled-stripe SLD permits feedback in a restricted section of its waveguide channel as well as incoherent emission in the direction parallel to the stripe. These two light beams are spatially separated, with the coherent output normal to the air/GaAs (gallium arsenide) chip interface and the incoherent refracting into the air at an angle determined by the angle between the stripe and the normal to the chip.

The emitted coherent light has a narrow bandwidth, and hence, a large coherence length which is necessary for high accuracy sensing of wavelength shifts in the source emission. The incoherent output is broadband and appropriate for use in the fiber-optic rotation sensor.

The shifts in the emission wavelength of the source are caused by changes in either the injection current to the device or in the device temperature. Such changes will result in wavelength shifts in both the coherent and the incoherent light beams.

In the angled-stripe configuration, because the coherent and incoherent emissions share the same active region, the temperature in the coherent light region is the same as that in the incoherent light region. Therefore, temperature changes in the active region will result in the same wavelength shifts in both the coherent and incoherent light emissions. These shifts are detected by a highly sensitive, large-opd-interferometer, and are used to generate an error signal which is used to control the temperature and/or the injection current in the active region of the SLD.

SUMMARY OF THE INVENTION

An angled-stripe optical device such as an SLD which emits both coherent and semicoherent or incoherent light is ideal for use in a high accuracy fiber-optic rotation sensor. The incoherent emission from the device, e.g., an SLD, is coupled into a fiber and propagates through the rotation sensor. The coherent light emitted by the device is coupled into a fiber and the effective emission wavelength is monitored by a stabilized interferometer.

Because the coherent light has a narrower bandwidth than the incoherent emission, a very sensitive stabilized interferometer with a large pathlength difference can be used to detect changes in the temperature in the active region of the SLD. Temperature changes are manifested as shifts in the effective wavelength of both the coherent and the incoherent emissions.

The wavelength shifts detected in the coherent light output are used to generate an error signal. This error signal drives a servo-loop which is filtered and closed around a thermoelectric cooler at the base of the SLD.

BRIEF DESCRIPTION OF THE DRAWINGS

The various features and advantages of the present description are presented in the following detailed description accompanied by drawings, in which.

DESCRIPTION OF THE PREFERRED EMBODIMENT

Figure 1:
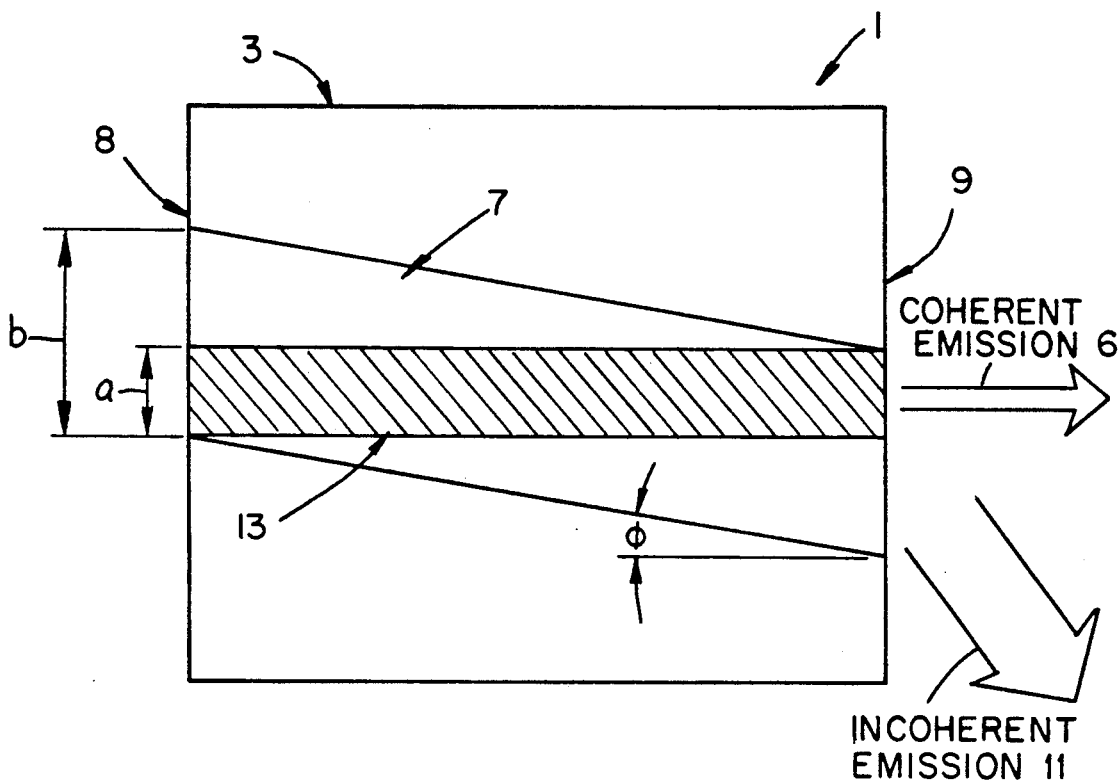
FIG. 1 is a perspective schematic of the angled-stripe SLD showing the aspect ratio of the widths of the coherent and incoherent waveguide channels and the spatial separation of the coherent and incoherent outputs, in accordance with the invention.

Referring to FIG. 1, the angled-stripe SLD for high-accuracy wavelength stabilization 1 comprises a GaAs SLD chip 3 grown using established planar channel growth techniques and cleaved at facets 8 and 9. The current stripe 7 will be of width b and inclination $\phi$ such that there is a single mode waveguide 13, of width a which will emit coherent light normal to the device facet 6 simultaneously with the spatially separated incoherent light emission 11.

Figure 1A:
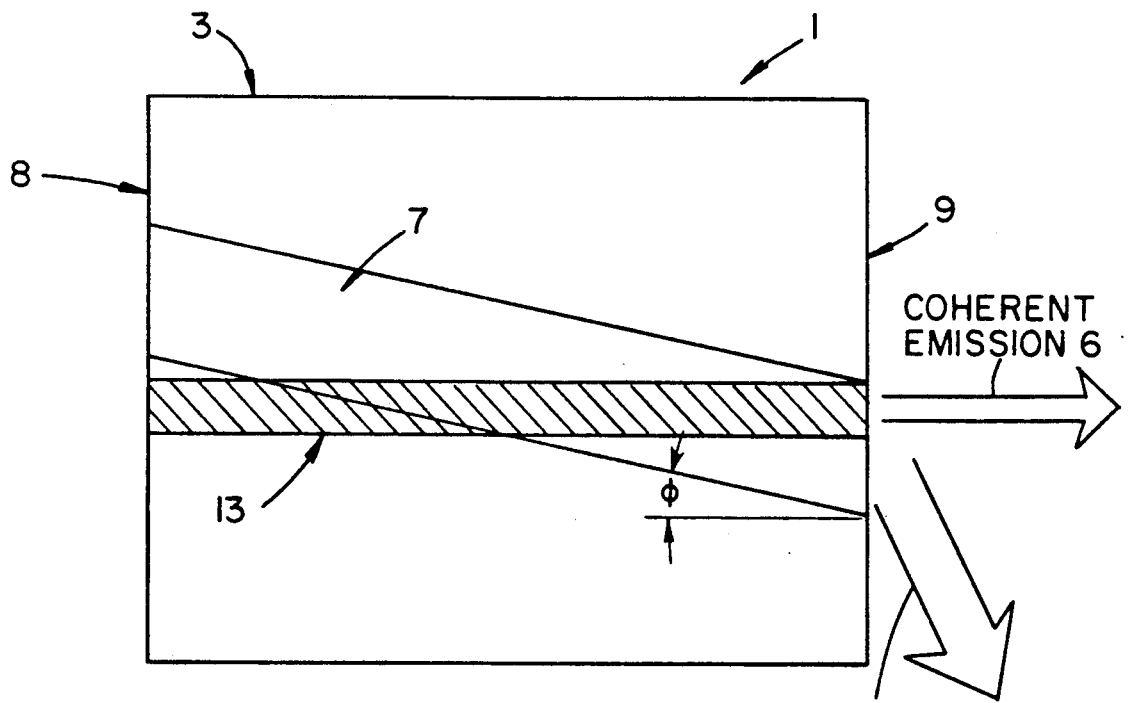
FIG. 1A is a perspective schematic of the angle-striped SLD showing the aspect ratio of the widths of the coherent and incoherent waveguide channels and the spatial separation of the coherent and incoherent outputs, in accordance with the invention, here with the channels partially overlapping.

Although FIG. 1 shows light emission from only one facet, these devices, in general, will emit light from both facets. This allows the option of coupling the coherent light from facet 8, and the incoherent light from facet 9. Facets 8 and 9 can be wholly or partially overlapping, as FIGS. 1 and 1A show. This arrangement enables the optical fibers to be brought close to the SLD facets, optimizing the light input into each independently without any interference with each other.

Figure 2:
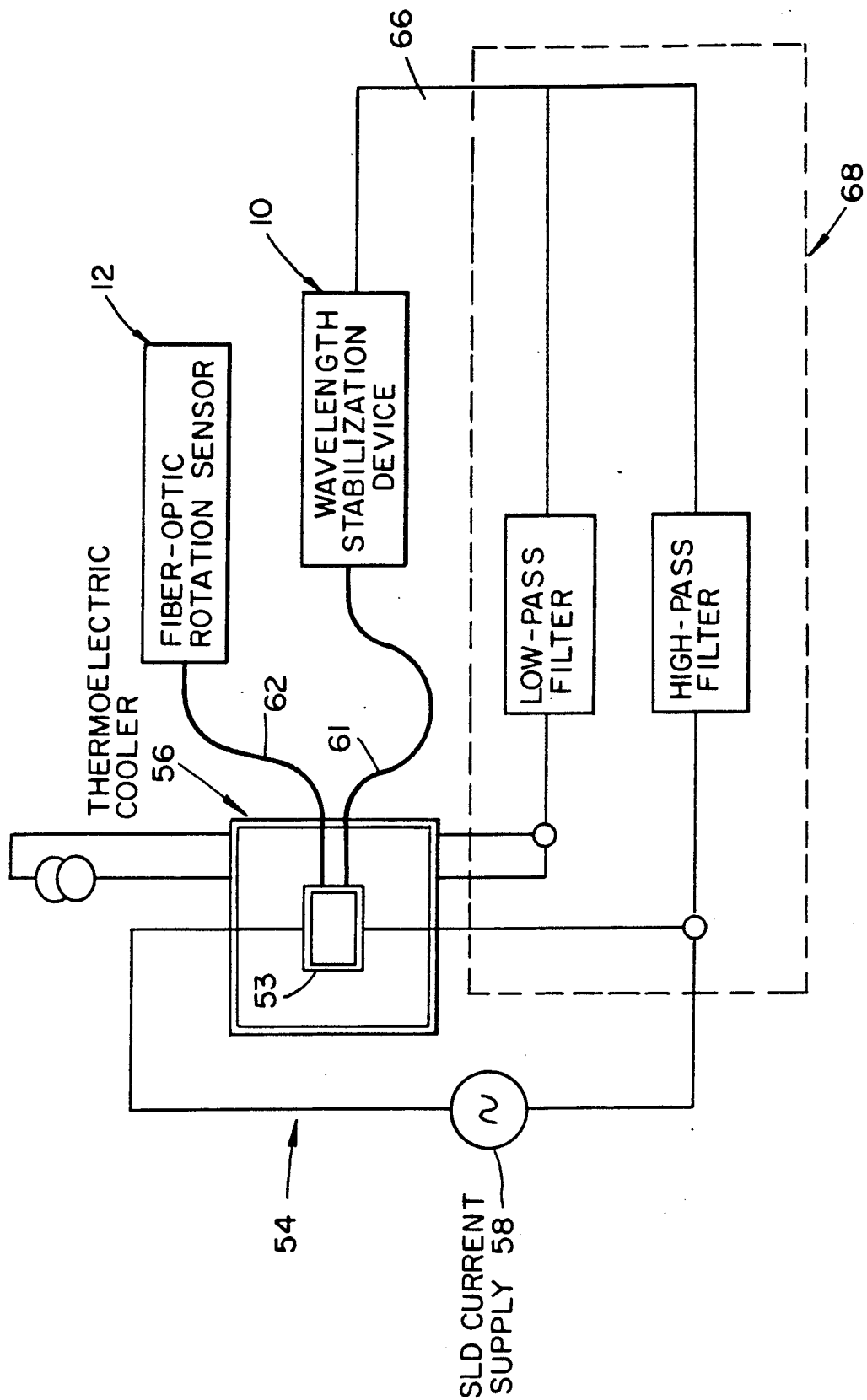
FIG. 2 is a schematic block diagram of the apparatus in accordance with the invention for stabilizing the wavelength of the SLD.

FIG. 2 is a block diagram of the angled-stripe wavelength stabilization device 54. The angled-stripe device is driven by a current supply 58 to generate optical outputs 6 and 11. These two optical outputs are coupled to fiber-optic rotation sensor 12 and to wavelength stabilization device 10 through means 61 and 62.

The error signal generated in wavelength stabilization device 10 is sent through leads 66 to signal conditioning network 68 consisting of electronic high-pass and low-pass filters. The low-pass filtered signal is used to close a servo loop around thermoelectric cooler 56. The high-pass filtered signal is conditioned and servoed around the drive current to SLD 53.

The above-described embodiments are furnished as illustrative of the principles of the invention, and are not intended to define the only embodiment possible in accordance with our teaching. Rather, the invention is to be considered as encompassing not only the specific embodiments shown, but also any others falling within the scope of the following claims.

What is claimed is:

1. An optical device comprising:
   a superluminescent diode including means for simultaneously emitting both coherent light and incoherent light;
   means for exciting said superluminescent diode into simultaneously emitting a beam of coherent light and a beam of incoherent light which can be spatially separated;
   first means external to said diode for channeling light;
   first means for coupling at least a portion of said beam of coherent light into said first means for channeling light;
   second means external to said diode for channeling light; and
   second means for coupling at least a portion of said beam of incoherent light into said second means for channeling light.

2. The optical device of claim 1 wherein said first and second means for channeling light are optical fibers.

3. The device of claim 2 wherein said superluminescent diode has an angled-stripe configuration.

4. An optical device comprising:
   an angled-stripe superluminescent diode having a first active region emitting coherent light between first and second substantially parallel end faces and a second active region emitting incoherent light overlapping at least part of said first active region;
   first fiber-connecting means connecting a first optical fiber to said first active region at said first end face; and
   second fiber-connecting means connecting a second optical fiber to said second active region at said first end face.

5. An apparatus for stabilizing the emission wavelength spectrum of a broadband light source comprising:
   a broadband light source including means for simultaneously emitting a beam of coherent light and a beam of incoherent light which are spatially separated;
   means for exciting said broadband light source into emitting said light beams;
   a large-optical-pathlength-difference interferometer capable of producing a light output signal representative of a phase difference between two light beams of incoherent light propagating along different optical paths in said interferometer;
   means for generating a wavelength error signal in response to said light output signal; and
   feedback control means for feeding said error signal back to said means for exciting said broadband light source and for stabilizing the output wavelength spectrum of said broadband light source.

6. The apparatus of claim 5 wherein said large-optical-pathlength-difference interferometer is a Mach-Zehnder interferometer.

7. A method of making an optical device useful for stabilizing the emission wavelength of a broadband light source for a fiber-optic rotation-sensing gyro comprising:
   providing an angled-stripe superluminescent diode having a first active region between first and second substantially parallel end faces and a second active region spatially separated from said first active region;
   attaching a first fiber-coupling means for connecting a first optical fiber to said first active region at said first end face; and
   attaching a second fiber-coupling means for connecting a second optical fiber to said second active region at said first end face.

8. The method of claim 7 further comprising:
   coupling a first optical fiber to said first fiber-coupling means; and
   coupling a second optical fiber to said second fiber-coupling means.

9. A method of making an optical device useful stabilizing the emission wavelength of a broadband light source for a fiber-optic rotation-sensing gyro comprising:
   providing an angled-striped superluminescent diode having a first active region between first and second substantially parallel end faces and a second active region spatially separated from said first active region;
   attaching a first fiber-coupling means for connecting a first optical fiber to said first active region at said first end face; and
   attaching a second fiber-coupling means for connecting a second optical fiber to said second active region at said second end face.

10. The method of claim 9 further comprising:

coupling a first optical fiber to said second fiber-coupling means.

11. A method for stabilizing the emission wavelength spectrum of a broadband light source comprising:
    exciting said broadband light source into simultaneously emitting a beam of coherent light and a beam of incoherent light which are spatially separated;
    coupling at least a portion of said beam of coherent light into a large-optical-pathlength-difference interferometer that includes means for producing a light output signal representative of a phase difference between first and second portions of said beam of coherent light propagating along different optical paths in said interferometer;
    generating an error signal in response to changes in the output wavelength of said light output signal; and
    using said error signal to control and stabilize said emission wavelength spectrum of said broadband light source.

12. The method of claim 11 wherein said exciting step comprises exciting an angled-stripe SLD.

13. A method of stabilizing the emission wavelength spectrum of a superluminescent diode that includes means for simultaneously emitting both coherent and incoherent light from a first active region and an adjacent, partially overlapping second active region, respectively, comprising:
    exciting said superluminescent diode into simultaneously emitting coherent light and incoherent light with an excitation means;
    coupling at least a portion of said coherent light into a larger-optical-pathlength-difference interferometer;
    producing a light output signal representative of a phase difference between first and second portions of said coherent light propagating along different optical paths in said interferometer;
    generating a wavelength error signal in response to said light output signal;
    controlling the temperature of said first active region by using said wavelength error signal to control said excitation means; and
    thereby stabilizing the emission wavelength spectrum of said superluminescent diode.

14. The method of claim 13 wherein said exciting step comprises exciting an angled-stripe SLD.

15. An optical device comprising:
    a light source that includes means for simultaneously emitting both coherent light and semicoherent light;
    means for exciting said light source into simultaneously emitting a beam of coherent light and a beam of semicoherent light which can be spatially separated, operatively connected to said light source;
    first means external to said light source for channeling light;
    first light-coupling means for coupling at least a portion of said beam of coherent light into said first means for channeling light, linking said light source with said first means for channeling light;
    second means external to said light source for channeling light; and
    second light-coupling means for coupling at least a portion of said beam of semicoherent light into said second means for channeling light, linking said light source with said second means for channeling light.

16. The optical device of claim 15 wherein said light source comprises a superluminescent diode.

17. The device of claim 16 wherein said superluminescent diode has an angled-stripe configuration.

18. The optical device of claim 16 wherein said first and second means for channeling light comprise optical fibers.

19. The optical device of claim 15 wherein said first and second light-coupling means comprise fiber-connecting means.

20. An apparatus for stabilizing the emission wavelength spectrum of a broadband light source that includes means for simultaneously emitting a beam of coherent light and a beam of semicoherent light which are spatially separated, comprising:
    means for exciting said broadband light source into emitting said beams of coherent and semicoherent light, operatively connected to said broadband light source;
    a large-optical-pathlength-difference reference interferometer capable of producing a light output signal representative of a phase difference between first and second beams of coherent light propagating along different optical paths in said interferometer at an output thereof;
    light coupling means for coupling at least a portion of said beam of coherent light into said reference interferometer, optically linking said light source and said interferometer;
    means for generating a wavelength error signal in response to said light output signal, operatively connected to said output of said reference interferometer and having an output; and
    feedback control means for stabilizing the output wavelength spectrum of said broadband light source, having an input connected to said output of said means for generating said wavelength error signal and producing a control signal at an output which is fed back to said means for exciting said broadband light source;
    wherein said beam of semicoherent light also is stabilized in wavelength.

21. The apparatus of claim 20 wherein said large-optical-pathlength-difference interferometer is a Mach-Zehnder interferometer.

22. The apparatus of claim 20 wherein said large-optical-pathlength-difference interferometer is a Michelson interferometer.

23. The apparatus of claim 20 wherein said light coupling means comprises an optical fiber.

24. A method for stabilizing the emission wavelength spectrum of a broadband light source, comprising:
    exciting a broadband light source into simultaneously emitting a beam of coherent light and a beam of semicoherent light which are spatially separated;
    coupling at least a portion of said beam of coherent light into a large-optical-pathlength-difference interferometer producing a light output signal representative of a phase difference between first and second portions of said beam of coherent light propagating along different optical paths in said interferometer;
    generating a wavelength error signal in response to said light output signal;
    generating a feedback control signal in response to said wavelength error signal; and feeding said control signal back to said means for exciting said broadband light source and thereby stabilizing the output wavelength spectrum of said broadband light source.

25. A method of making an optical device useful for stabilizing the emission wavelength spectrum of an angled-stripe superluminescent diode having a first active region between first and second substantially parallel end faces and a second active region, spatially separated from said first active region, said superluminescent diode being used as a broadband light source, comprising:

attaching a first fiber-coupling means for connecting a first optical fiber to said first active region at said first end face; and attaching a second fiber-coupling means for connecting a second optical fiber to said second active region at said first end face.

26. The method of claim 25 further comprising:

coupling a first optical fiber to said first fiber-coupling means; and coupling a second optical fiber to said second fiber-coupling means.

* * * * *